US009590653B2

(12) United States Patent
Bogner et al.

(10) Patent No.: US 9,590,653 B2
(45) Date of Patent: Mar. 7, 2017

(54) METHOD AND DEVICE FOR USE IN ANALOG-TO-DIGITAL CONVERSION

(71) Applicant: Infineon Technologies AG, Neubiberg (DE)

(72) Inventors: Peter Bogner, Wernberg (AT); Clifford Fyvie, Moray (GB); Niranjan Reddy Suravarapu, Villach (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/745,620

(22) Filed: Jun. 22, 2015

(65) Prior Publication Data

US 2016/0020778 A1 Jan. 21, 2016

(30) Foreign Application Priority Data

Jul. 16, 2014 (DE) .................. 10 2014 110 012

(51) Int. Cl.
*H03M 1/12* (2006.01)
*H03M 1/46* (2006.01)
*H03M 1/00* (2006.01)
*H03M 1/08* (2006.01)

(52) U.S. Cl.
CPC .......... *H03M 1/468* (2013.01); *H03M 1/002* (2013.01); *H03M 1/0863* (2013.01); *H03M 1/466* (2013.01)

(58) Field of Classification Search
CPC ...... H03M 1/468; H03M 1/466; H03M 1/804; H03M 1/12; H03M 1/46; H03M 1/002; H03M 1/0607; H03M 1/66

USPC .................................. 341/155, 172
See application file for complete search history.

(56) References Cited

U.S. PATENT DOCUMENTS

| 5,852,415 A | 12/1998 | Cotter et al. |
| 6,020,841 A * | 2/2000 | Susak ............... H03K 17/6257 341/161 |
| 6,958,722 B1 * | 10/2005 | Janakiraman ......... H03M 1/144 341/156 |

(Continued)

FOREIGN PATENT DOCUMENTS

| JP | H07-336224 A | 12/1995 |
| JP | H09-512686 A | 12/1997 |

(Continued)

OTHER PUBLICATIONS

German Office Action issued for DE 10 2014 110 012.3 dated Mar. 19, 2015.

(Continued)

*Primary Examiner* — Linh Nguyen
(74) *Attorney, Agent, or Firm* — Schiff Hardin LLP (57) ABSTRACT

Disclosed herein are embodiments of a precharge sample-and-hold circuit. The circuit has an input terminal, a reference voltage terminal and an output terminal. Further, the circuit has a sampling capacitance coupled between the input terminal and the reference voltage terminal and configured to provide the sample voltage when said sample-and-hold circuit is in a holding mode and a cancellation capacitance. Implementations of a precharge sample-and-hold circuit and of methods to operate a precharge sample-and-hold circuit in an analog/digital converter are also disclosed.

20 Claims, 6 Drawing Sheets

(56) References Cited

U.S. PATENT DOCUMENTS

| | | | | |
|---|---|---|---|---|
| 7,106,237 B1* | 9/2006 | Confalonieri | ......... | H03M 1/002 |
| | | | | 341/155 |
| 7,969,167 B2* | 6/2011 | Khanna | ................ | G01P 15/125 |
| | | | | 324/678 |
| 2005/0258998 A1* | 11/2005 | Confalonieri | ........ | G11C 27/024 |
| | | | | 341/172 |
| 2006/0244647 A1* | 11/2006 | Takano | ................ | H03M 1/804 |
| | | | | 341/144 |
| 2008/0143570 A1 | 6/2008 | Andersson et al. | | |
| 2009/0167587 A1* | 7/2009 | Xu | ........................ | H03M 1/466 |
| | | | | 341/172 |
| 2010/0188278 A1* | 7/2010 | Khanna | ................ | H03M 1/466 |
| | | | | 341/172 |
| 2012/0081243 A1* | 4/2012 | Kim | .................... | H03M 1/0678 |
| | | | | 341/110 |
| 2014/0085118 A1* | 3/2014 | Tsai | ...................... | H03M 1/462 |
| | | | | 341/122 |
| 2014/0354460 A1* | 12/2014 | Park | ........................ | H03M 1/18 |
| | | | | 341/155 |
| 2015/0054668 A1* | 2/2015 | van der Goes | ....... | H03M 1/403 |
| | | | | 341/172 |

FOREIGN PATENT DOCUMENTS

| | | |
|---|---|---|
| JP | 2002-043942 A | 2/2002 |
| JP | 2005-210182 A | 8/2005 |

OTHER PUBLICATIONS

Office Action dated Jun. 14, 2016 for Japanese Patent Application No. 2015-140190.

* cited by examiner

METHOD AND DEVICE FOR USE IN ANALOG-TO-DIGITAL CONVERSION

RELATED APPLICATION

This patent application claims priority to German Patent Application No. 10 2014 110 012.3, filed Jul. 16, 2014, which is incorporated herein by reference in its entirety.

BACKGROUND

Disclosed herein are techniques related to precharging an analog-to-digital (DAC) capacitance. For example, DAC capacitances are used in an analog-to-digital converter (ADC). An input of an analog-to-digital converter can form a switched capacitor load. For example, an input of a successive-approximation register analog-to-digital converter (SAR-ADC) captures an analog input voltage signal with either an external sample-and-hold (S/H) device or a sample-and-hold function internal to the SAR-ADC. The SAR-ADC compares the analog input voltage to known fractions of a reference voltage used with the SAR-ADC. The reference voltage determines the full-scale input voltage range of the SAR-ADC.

These days, successive-approximation register analog-to-digital converters use a capacitive, digital-to-analog converter (C-DAC) to successively compare bit combinations and set or clear appropriate bits into a data register. At an input of an SAR-ADC converter, an input signal first 'sees' a switch. The switch, when closed, creates a switch resistance in series with a capacitive array connected between a comparator and, selectively, either the input, a reference terminal, or ground. Once the capacitive array acquires the input signal, an input switch opens to disconnect the capacitive array from the input. Now, selectively, at least one DAC capacitance of the capacitive array is connected to the reference terminal. Charge is redistributed among all DAC capacitances. Accordingly, voltage at the comparator input moves. If a voltage at the sampling capacitance is larger than a fraction of the reference voltage as represented by the selected DAC capacitance, then the comparator outputs a 0 level signal, otherwise the comparator outputs a 1 level signal.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In an aspect, a method as defined in the independent method claim is described. In another aspect, a device as defined in the independent device claim is described. The dependent claims define embodiments according to the invention in one or more aspects. It is to be noted that features of these embodiments may be combined with each other unless specifically noted to the contrary. For example, elements of method embodiments may be implemented in embodiments of the device. For example, features of an embodiment of the device may be used to perform steps of an embodiment of the method.

The described embodiments can be useful, for example, in the field of analog-to-digital-conversion. At an input of a successive-approximation-register analog-to-digital converter (SAR-ADC, herein also SAR converter), according to some embodiments, an input signal first 'sees' a switch wherein a closed switch creates a switch resistance in series with a capacitive array. One terminal ('comparator side terminal') of these 'switched capacitors' couples to an inverting input of a comparator. Another terminal ('reference side terminal') can tie onto input voltage, reference voltage, or ground. Initially, the reference side terminal couples to the input signal. Once the capacitive array completely acquires the input signal, an input switch opens and the SAR converter starts a conversion process. During the conversion process, the reference side terminal of a capacitor associated with a most significant bit (MSB) in a digital representation of the analog signal connects to the reference voltage while the other capacitors connect to ground. This action redistributes charge among all the capacitors. The comparator's inverting input moves up or down in voltage according to charge balancing. If the voltage at the inverting input of the comparator is greater than half the reference voltage, the converter assigns "0" to the MSB and transmits that value out of a serial port of the SAR-ADC. If this voltage is less than half the reference voltage, the converter transmits a value "1" out of the serial port, and the converter connects the MSB capacitor to ground. Following the MSB assignment, this process repeats with the MSB-1 capacitor. The time required for the SAR-ADC conversion process to occur consists of the acquisition and conversion time. At the conclusion of the total conversion process, the SAR-ADC can enter a sleep mode.

As described above, an ADC can use switched capacitors. Switched capacitors can be charged using a reference voltage causing a voltage drop. In a typical arrangement several switched capacitors operate synchronously; in such an arrangement charge current can accumulate to current spikes that can cause malfunction. With reference to the above mentioned conventional techniques and issues associated therewith, at least one effect of techniques disclosed herein can be that the described method can be performed more efficiently than conventional methods of similar functionality. At least one effect can be that the described device can be operated more efficiently than conventional devices of similar functionality.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognise additional features and advantages upon reading the following detailed description, and upon viewing the accompanying drawings.

BRIEF DESCRIPTION OF THE DRAWINGS

The claimed subject matter is described in detail below with reference to the drawings. The detailed description references the accompanying figures. The same reference numerals are used throughout the drawings to reference like features and components. Multi-digit reference numerals are used to denote elements of the embodiments. Where multiple embodiments are described, the least significant digits of the multi-digit reference numerals reference features and components that are alike in the various embodiments, whereas the most significant digit can reference the specific embodiment illustrated in the corresponding figure. For simplicity, like elements in the various embodiments will typically only be introduced when first mentioning the element in one embodiment. Having regard to the illustration of switches, the following drawing convention is used: open switches are shown with an "o", closed switches are illustrated without any "o".

DETAILED DESCRIPTION

For purposes of explanation, numerous specific details are set forth in order to provide a thorough understanding of the claimed subject matter. It may be evident, however, that the claimed subject matter may be practised without these specific details.

This disclosure is directed to techniques for implementing and operating a circuit for use in an analog-to-digital converter (ADC), wherein the ADC has a so-called capacitive digital-to-analog (C-DAC) converter, herein also briefly referred to as 'C-DAC' converter or just 'DAC' converter, for use as a reservoir for charge to be used in a comparison with charge loaded in sampling capacitors in the ADC, the latter capacitors collectively referred to as sampling capacitance. Techniques described herein use a further voltage source in place or in addition to a reference voltage source of the conventional ADC circuit. The additional voltage source is configured to reduce a current from a high-resistance reference voltage source to the C-DAC. At least one effect can be to lower an amount of current from the reference voltage source to the C-DAC converter when compared with conventional solutions. Thus, in some embodiments voltage drop on the reference voltage source can be avoided at least to some extent since less current needs to flow from the reference voltage source to the C-DAC. At least one effect can be avoidance of current spikes and adverse effects of such spikes on operational stability of the ADC when compared with conventional solutions. Some techniques described herein use the further voltage source in place of or, in particular, as complement to a reference voltage source.

Figure 1:
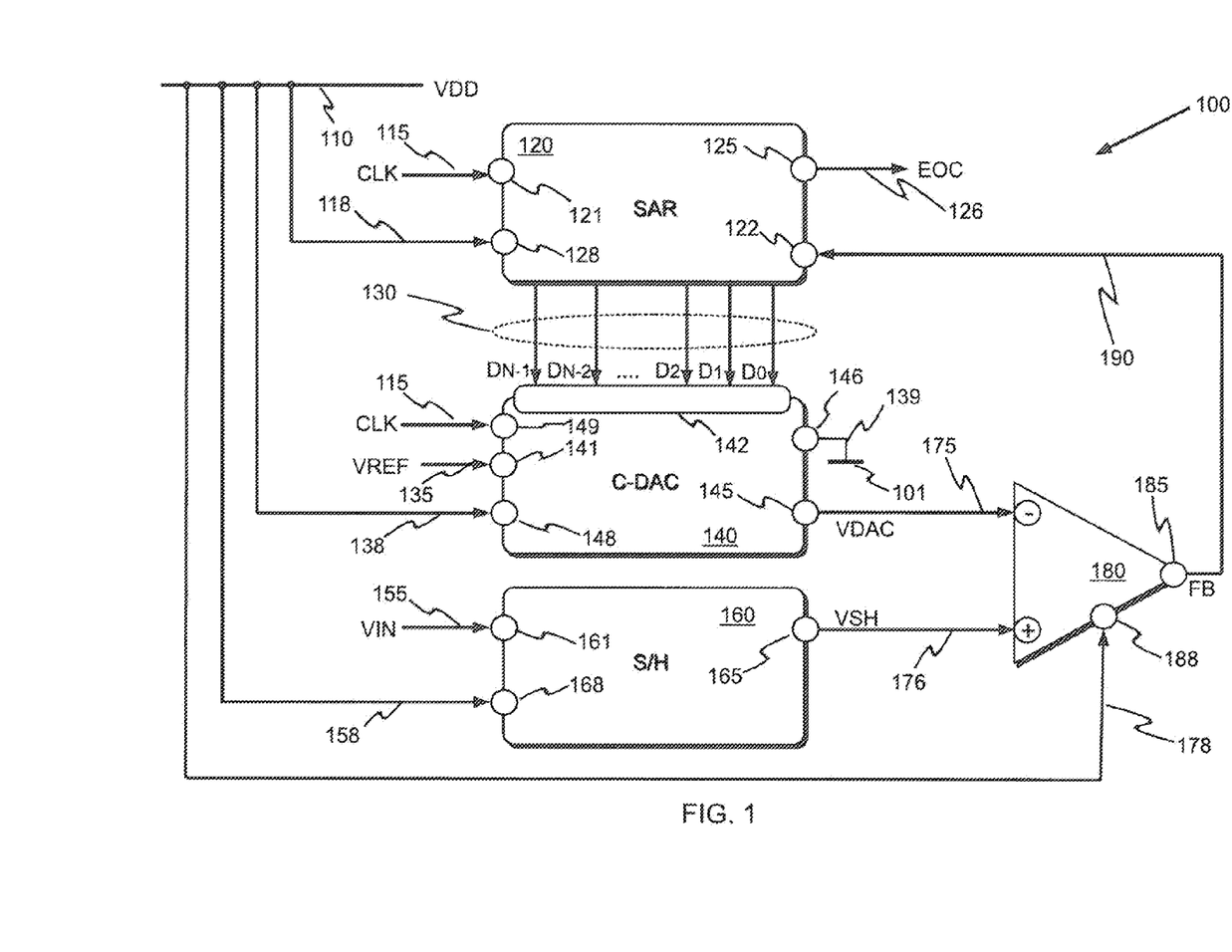
FIG. 1 is a diagram schematically illustrating an exemplary implementation of an analog-to-digital conversion apparatus according to some embodiments.

FIG. 1 is a diagram that schematically illustrates an exemplary analog-to-digital converter (ADC) 100 implementing a device according to some embodiments. ADC 100 comprises a plurality of functional and/or circuit blocks. In particular, ADC 100 comprises a successive-approximation-register (SAR) 120, a capacitive digital-to-analog (C-DAC) converter 140, a sample and hold (S/H) unit 160, and a comparator 180. It should be understood that, while reference is made herein to the afore-disclosed elements as functional blocks and/or as circuit blocks, as the case may be, two separately disclosed blocks can form a single circuit block that is configured to provide the two functionalities. ADC 100 is configured to receive, via a clock line 115, a clock signal CLK. In some embodiments clock signal CLK is derived from a master clock signal used in an implementation environment of ADC 100. In some embodiments clock signal CLK is specifically generated for used with ADC 100. In some embodiments ADC 100 comprises a clock signal generator configured to generate clock signal CLK. While reference is made to clock signal CLK, it should be understood that clock signal CLK is representative for a clock signal as needed for the particular circuitry or functionality disclosed as recipient of the clock signal CLK. Thus, clock signal CLK provided to different portions of ADC 100 such as successive approximation register (SAR) 120 and C-DAC converter 140, in some embodiments, is not the same for both; likewise reference to clock line 115 coupling to different portions of ADC 100, in some embodiments, refers to separate lines configured to transmit the respective clock signal CLK as needed in the coupled portion of ADC 100. Further, ADC 100 is configured to receive, via a reference voltage line 135, a reference voltage signal VREF, and, via an input voltage line 155, an input voltage signal VIN. ADC 100 is coupled to a supply voltage line 110 whose voltage is set to a supply voltage level VDD. Herein, the wording 'coupled' is not limited to but includes the meaning of 'connected' and 'directly connected'. For example, according to some embodiments ADC 100 can be directly connected to supply voltage line 110, i.e., with the least resistance. According to some embodiments, coupling of ADC 100 to supply voltage line 110, can include circuit elements such as, for example, a level shifter and/or a filter. Successive approximation register (SAR) 120 is coupled to a group 130 of N digital signal lines configured to selectively output digital control signals D0, D1, D2, . . . , DN-2, DN-1. Further, ADC 100 is configured to output, via an SAR output line 126, an end-of-conversion signal EOC indicative of digital control signals D0, D1, D2, . . . , DN-2, DN-1 being a result of analog-to-digital conversion.

Successive approximation register (SAR) 120 has a clock terminal 121 to receive clock signal CLK and a supply voltage terminal 128 connected, via a SAR supply voltage branch 118, to supply voltage line 110. Herein, the wording 'terminal' is not limited to mean a line end, socket, plug or other structural end point associated with the wording 'terminal'. Rather, the wording 'terminal' is used to denote a location in the circuit that, in operation of the circuit, can be defined to receive the specified signal, such as, in the case of clock terminal 121, any circuit portion that is provided with and/or transmits clock signal CLK. Successive approximation register (SAR) 120 is coupled via the group 130 of N digital signal lines, to C-DAC converter 140 and configured to selectively output the digital control signals D0, D1, D2, . . . , DN-2, DN-1 for use in control of C-DAC converter 140. Herein, since the same principles disclosed herein apply to all digital control signals output from SAR 120 to C-DAC converter 140 the same, when exemplary reference is made to a single digital control signal output from SAR 120 to C-DAC converter 140, such as digital control signal D2, for simplicity, the letter "D" alone can be used to denote the digital control signal, while the index will be omitted. According to some embodiments successive approximation register (SAR) 120 comprises a feedback terminal 122 that is coupled to comparator 180 and configured to receive, via a feedback line 190, a feedback signal FB from comparator 180. Successive approximation register (SAR) 120 has an ADC control output terminal 125 configured to output, via SAR output line 126, an end-of-conversion signal 125.

According to some embodiments capacitive digital-to-analog (C-DAC) converter 140 has a reference voltage terminal 141 to receive, for example from some reference voltage source (not shown) via a reference voltage line 135, or otherwise to be set to a reference voltage signal VREF. Capacitive digital-to-analog (C-DAC) converter 140 has a supply voltage terminal 148 connected, via a C-DAC supply voltage branch 138, to supply voltage line 110. In some embodiments, C-DAC converter 140 has a DAC bias terminal 146 coupled, via discharge line 139, to ground 101. In some embodiments, C-DAC bias terminal 146 can be coupled to a bias voltage terminal of analog-to-digital converter (ADC) 100 set to a different voltage level than ground voltage. C-DAC converter 140 comprises a bank 142 of digital signal input terminals, the digital signal input terminals each coupled to a digital signal line of group 130 of digital signal lines and configured to receive a digital control signal D from SAR 120. According to some embodiments C-DAC converter 140 comprises an DAC output terminal 145 configured to output, via a DAC reference line 175, a DAC voltage signal VDAC to comparator 180. In some embodiments, successive approximation register (SAR) 120 has a SAR clock terminal 149 coupled to clock line 115 to receive clock signal CLK.

According to some embodiments sample-and-hold (S/H) unit 160 has an input voltage signal terminal 161 to receive, via input voltage line 155, input voltage signal VIN. In some implementations input voltage signal VIN is an analog signal that can vary with time. Input voltage signal VIN can be provided to be digitised by the ADC. In some embodiments, seen from input voltage signal terminal 161, sample-and-hold (S/H) unit 160 is a high-impedance circuit. In some embodiments the high-impedance can be at least 10 kOhm. Further, sample-and-hold (S/H) unit 160 comprises a supply voltage terminal 168 coupled, via a S/H supply voltage branch 158, to supply voltage line 110. Sample-and-hold (S/H) unit 160 comprises an sample-and-hold output terminal 165 configured to output, via a sample-and-hold line 176, a sample-and-hold voltage signal VSH to comparator 180. According to some embodiments an ADC driver circuit is provided that, in some implementations, uses an operational amplifier (op amp) to separate sample-and-hold unit 160 from a high impedance input source. An R/C low-pass circuit having a filter resistance 132 and a filter capacitance 133 can follow to perform functions going back to an operational amplifier and forward to sample-and-hold unit 160. A resistance of the low-pass circuit keeps the amplifier stable by isolating the amplifier's output stage from a capacitance of the low-pass circuit. The capacitance of the low-pass circuit provides a stable input source to sample-and-hold unit 160.

Comparator 180 has a negative input terminal (−) configured to receive, via DAC reference line 175, DAC voltage signal VDAC. Comparator 180 has a positive input terminal (+) configured to receive, via sample-and-hold line 176, the sample-and-hold voltage signal. Further, comparator 180 comprises a supply voltage terminal 188 connected, via a comparator supply voltage branch 178, to supply voltage line 110. Comparator 180 is configured to output, via feedback line 190, feedback signal FB to feedback terminal 122 of successive approximation register (SAR) 120.

Figure 2:
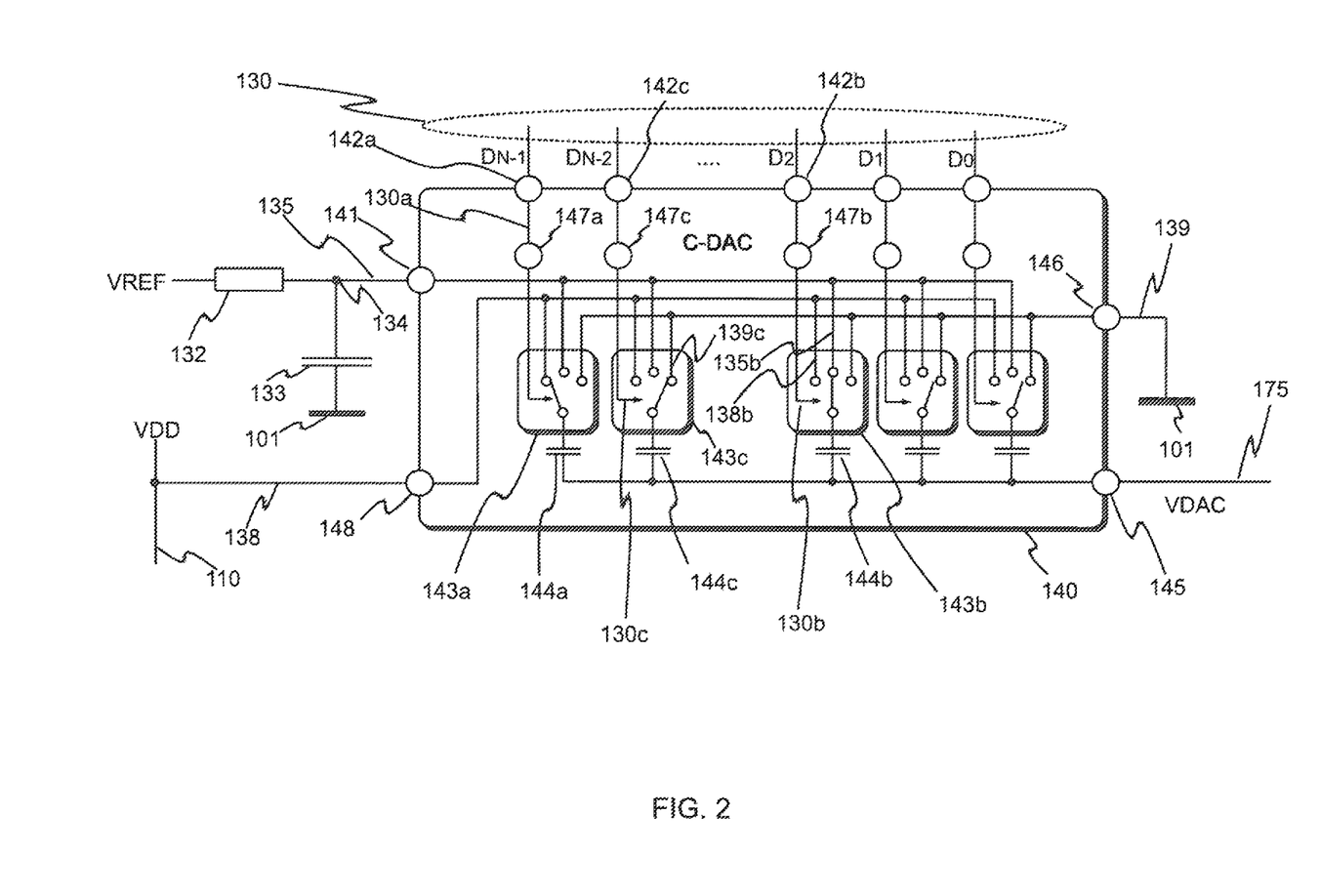
FIG. 2 is a schematic circuit diagram illustrating an exemplary implementation, in the analog-to-digital conversion apparatus shown in FIG. 1, of a capacitive digital-to-analog (C-DAC) converter according to some embodiments.

FIG. 2 is a schematic circuit diagram illustrating an exemplary implementation, in the analog-to-digital conversion apparatus shown in FIG. 1, of a capacitive digital-to-analog (C-DAC) converter according to some embodiments. C-DAC converter 140 includes N digital-to-analog (DAC) capacitances 144a, 144b, 144c. Herein, since the same principles disclosed herein apply to all digital-to-analog capacitances the same, when exemplary reference is made to a single DAC capacitance, such as DAC capacitance 144a, for simplicity, the reference numeral "144" alone will be used to denote the DAC capacitance, while the letter suffix will be omitted. One side of DAC capacitances 144a, 144b, 144c is coupled to DAC reference line 175. In some embodiments the one side of DAC capacitances 144a, 144b, 144c is directly connected to DAC reference line 175. The other side of DAC capacitances 144 is each coupled to an associated DAC switch arrangement 143a, 143b, 143c. Herein, since the same principles disclosed herein apply to all DAC switches the same, when exemplary reference is made to a single DAC switch arrangement, such as DAC switch arrangement 143a, for simplicity, the reference numeral "143" alone can be used to denote the DAC switch arrangement, while the letter suffix may be omitted. In some embodiments the other side of DAC capacitance 144 is directly connected to the associated DAC switch 143. In embodiments as illustrated in FIG. 2, DAC switch arrangements 143a, 143b, 143c are provided as N triple switches that each allow to be set to three different connective states. It should be understood that other implementations can achieve similar effect and provide for equivalent functionality, as will be shown below when an exemplary arrangement of DAC switch arrangement 143 is discussed in detail. In a precharge state, DAC switch arrangement 143 is set to couple the associated DAC capacitance 144 to DAC voltage supply branch 138 (as shown, for example, in the case of DAC switch 144a). In a reference charge state, DAC switch arrangement 143 is set to couple the associated DAC capacitance 144 to reference voltage line 135 (as shown, for example, in the case of DAC switch 144b). In a discharge state, DAC switch 144 is set to couple the associated DAC capacitance 144 to discharge line 139 (as shown, for example, in the case of DAC switch 144c).

C-DAC converter 140 includes N digital signal input terminals 142a, 142b configured to receive, from SAR 120 (not shown in FIG. 2), digital control signals D2, DN-2, DN-1 on the group 130 of digital signal lines 130a, 130b, 130c. Herein, since the same principles disclosed herein apply to all digital signal lines the same, when exemplary reference is made to a single digital signal line, such as digital signal lines 130a, for simplicity, the reference numeral "130" of the group will alone be used to denote the digital signal line, while the letter suffix will be omitted. C-DAC converter 140 is configured to direct digital control signals received from SAR unit 120 on digital signal lines 130a, 130b, 130c to the DAC switch 143a, 143b, 143c associated with digital signal line 130a, 130b, 130c. Thus, digital control signals can be used in control of C-DAC converter 140, for example, to control switch states of DAC switches 143, as will become apparent from a more detailed discussion of some embodiments below. In some embodiments, as illustrated in FIG. 2, DAC switch control circuitry 147a, 147b, 147c is provided and configured to process the digital control signals D2, DN-2, DN-1 received from successive approximation register (SAR) 120 and to provide digital control signals D2, DN-2, DN-1 signals as processed digital control signals to the DAC switch 143a, 143b, 143c associated with digital signal line 130a, 130b, 130c. Processing, in some embodiments, takes account of clock signal CLK, for example, to avoid setting DAC switch 143a, 143b, 143c to an indefinite state.

In an embodiment reference voltage terminal 141 of C-DAC converter 140 is coupled to a filter arrangement comprising a filter resistance 132 and a filter capacitance 133 that are connected to a node 134 on reference voltage line 135.

Figure 3:
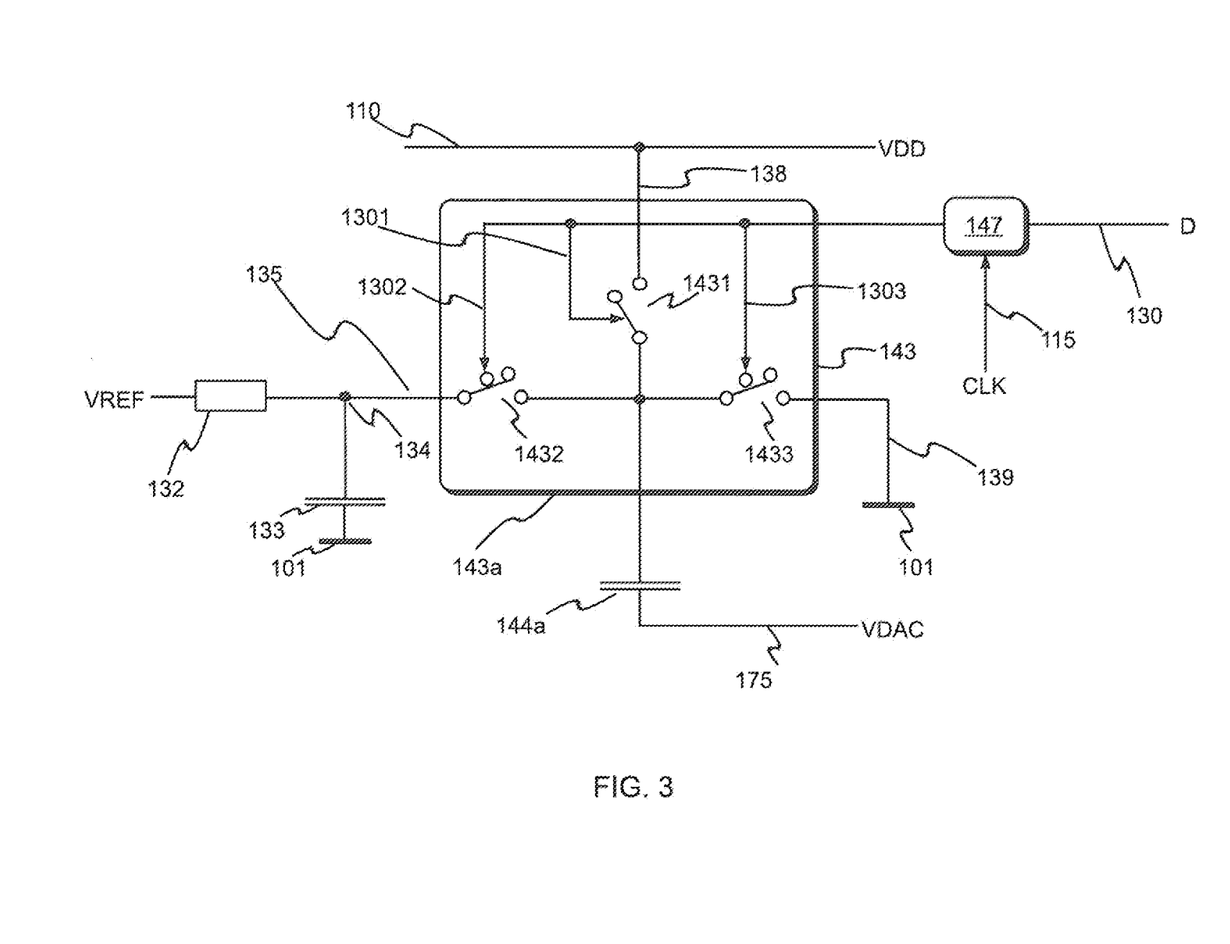
FIG. 3 is a schematic circuit diagram illustrating an exemplary implementation, in the capacitive digital-to-analog (DAC) converter shown in FIG. 2, of a switch arrangement according to some embodiments.

FIG. 3 is a schematic circuit diagram illustrating an exemplary implementation, in the capacitive digital-to-analog (DAC) converter shown in FIG. 2, of an arrangement of triple switch 143 according to some embodiments. Merely as an example, an embodiment of an arrangement of switch arrangement 143a set to precharge state is shown. DAC switch arrangement 143 comprises a precharge switch 1431 that, when in CLOSE state, is configured to couple DAC capacitance 144 to DAC supply voltage branch 138. Further, DAC switch arrangement 143 comprises a reference voltage switch 1432 that, when in CLOSE state, is configured to couple DAC capacitance 144 to reference voltage line 135. DAC switch arrangement 143 comprises a discharge switch 1433 that, when in CLOSE state, is configured to couple DAC capacitance 144 to discharge line 139. Further, in some embodiments DAC switch arrangement 143 includes branches 1301, 1302, 1303 of digital signal line 130 configured to provide digital control signal D to control terminals of precharge switch 1431, reference voltage switch 1432 and discharge switch 1433, respectively. According to some implementations, DAC switch arrangement 143 includes transistors, at least one for each, precharge switch 1431, reference voltage switch 1432 and discharge switch 1433. In an embodiment, switch arrangement 143a is configured such that no two of precharge switch 1431, reference voltage switch 1432 and discharge switch 1433 are in CLOSE state at the same time. It should be understood that one DAC switch arrangement 143 as disclosed and explained herein associated with digital signal line 130 for providing digital control signal D is exemplary for DAC switch arrangements 143a, 143b and 143c, and, in an embodiment, for the group of all DAC switch arrangements comprised in capacitive digital-to-analog converter (C-DAC) converter 140 and configured to switch between triple states.

Figure 4:
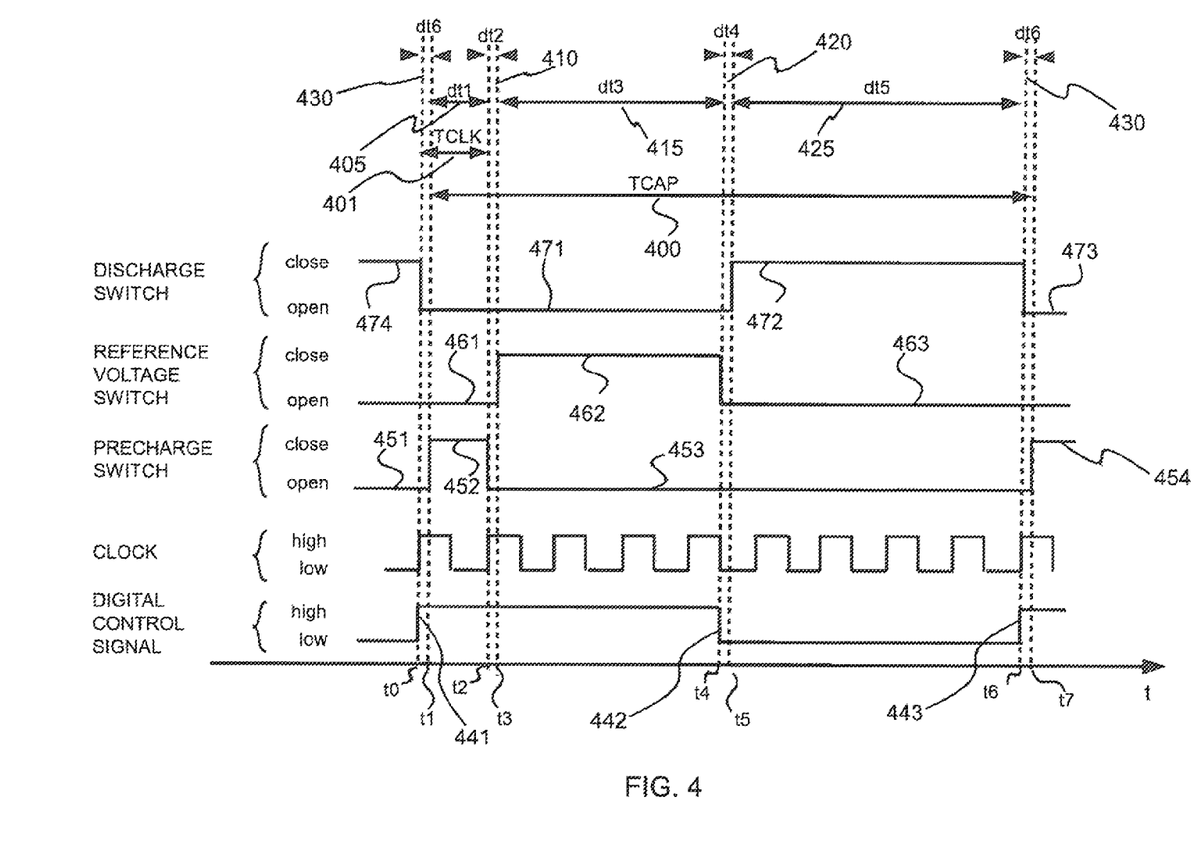
FIG. 4 is a time line showing switch states when operating the switch arrangement shown in FIG. 3.

Operation of some embodiments will now be disclosed with reference to FIG. 4 which is a time line showing switch states when operating an implementation of the capacitive digital-to-analog converter shown in FIG. 3 throughout one period TCAP to undergo a cycle 400 of work phases that includes precharge phase, reference charge phase and discharge phase.

Throughout operation of exemplary analog-to-digital converter (ADC) 100, clock signal CLK provided on clock line 115 periodically switches between HIGH level and LOW level. Herein, the wording 'HIGH' level and 'LOW' level with regards to clocking and/or signalling, unless specifically said otherwise, is merely to distinguish two clock states or signal states, respectively, and the terms can be used interchangeably, i.e., the described operations can also be implemented with inverse signalling or with mixed signalling, i.e., as the case may be, on a falling or on a rising signal edge, as shown in the example of the clock signal CLK illustrated in FIG. 4 at time t0 and at time t4. More particularly, in FIG. 4, one clock period TCLK is shown, at reference numeral 401, between time t0 and time t2. In the example, clock signal CLK has a duty cycle of fifty percent; however, other duty cycle values can also be used. Clock signal CLK is used to synchronise the operation described herein. In some embodiments, clock signal CLK synchronises operation of successive approximation register (SAR) 120 that, accordingly, outputs digital control signals D0, D1, D2 . . . DN-2, DN-1 to capacitive digital-to-analog (C-DAC) converter 140 synchronised to clock signal CLK. In some embodiments, operation of successive approximation register (SAR) 120 can be synchronised to another clock source such as a separate clock. For example, another clock source may be used in operation of comparator 180 as well as in operation of successive approximation register (SAR) 120. According to some implementations SAR 120 is operative as a selector and configured to select DAC switch arrangements 143a, 143b, 143c to undergo the cycle of work phases of precharge phase, reference charge phase and discharge phase. Thus, in some implementations, selected ones of DAC switch arrangements 143a, 143b, 143c may receive digital control signals from SAR 120 as described below.

At time t0, precharge switch 1431, reference voltage switch 1432 and discharge switch 1433 of DAC switch arrangement 143 are in OPEN state. Synchronised to clock signal CLK, successive approximation register (SAR) 120 outputs, amongst others, digital control signal D on the associated digital signal line. In capacitive digital-to-analog (C-DAC) converter 140, in particular in switch arrangement 143 that is connectively coupled to digital signal line 130, digital control signal D is distributed to precharge switch 1431, reference voltage switch 1432 and discharge switch 1433.

At time t1, work phase cycle 400 including precharge phase, reference charge phase and discharge phase of the selected DAC capacitance 144 begins. Digital control signal D received at precharge switch 1431 causes precharge switch 1431 to be set in CLOSE state. Thus, precharge switch 1431 provides a connection for charge to flow from supply voltage line 110 via DAC supply voltage branch 138 and precharge switch 1431 onto DAC capacitance 144. During time interval 405 reference voltage switch 1432 and discharge switch 1433 are in open state (as shown in FIG. 3) so that DAC capacitance 144 does neither receive charge via reference voltage line 135 nor discharge to ground. After a time interval 405 of a length dt1 sufficiently long to charge DAC capacitance 144 close to the level VDD of the supply voltage, at t2, received digital control signal D controls precharge switch 1431 to enter OPEN state. Thus, precharge switch 1431 disconnects DAC capacitance 144 from voltage supply line 110. During a time interval 410 of length dt2, precharge switch 1431, reference voltage switch 1432 and discharge switch 1433 of DAC switch arrangement 143 are in OPEN state. Thus, overlap of two switches in CLOSE state and associated indefiniteness of circuit state, short circuit current flow from voltage source to ground and other effects that are adverse to a safe operation of the device, are securely avoided. According to some embodiments, in comparison with the length dt1 of time interval 405, the length dt2 of time interval 410 can be short, wherein technological parameters of the manufacturing processes used in manufacturing the implementation can determine a minimum length dt2 of time interval 410.

At time t3, digital control signal D received at reference voltage switch 1432 controls reference voltage switch 1432 to enter CLOSE state. Thus, reference voltage switch 1432 provides a connection for charge to flow from the reference voltage source, via reference voltage filter arrangement 132, 133, 134, reference voltage line 135 and reference voltage switch 1432 onto DAC capacitance 144. After a time interval 415 of a length dt3 sufficiently long to charge DAC capacitance 144 to the level VREF of the reference voltage, at t4, received digital control signal D controls reference voltage switch 1432 to enter OPEN state. Thus, reference voltage switch 1432 disconnects DAC capacitance 144 from reference voltage line 135. During a time interval 420 of length dt4, precharge switch 1431, reference voltage switch 1432 and discharge switch 1433 of DAC switch arrangement 143 in OPEN state. Thus, overlap of two switches in CLOSE state and indefiniteness of circuit state, short circuit current flow from voltage source to ground and other effects that are adverse to a safe operation of the device, are securely avoided. In comparison with the length dt1 of time interval 405 the length dt4 of time interval 410 can be short.

At time t5, digital control signal D2 received at discharge switch 1433 controls discharge switch 1433 to enter CLOSE state. Thus, discharge switch 1433 provides a connection for charge to flow from DAC capacitance 144 via discharge switch 1433 and discharge line 139 to ground 101. In some implementations discharge may be performed to some other bias voltage level than ground. In some embodiments, not illustrated, the principles disclosed herein with reference to charging can also be applied to discharging. Thus, discharge is performed in more than a single stage to different potentials. For example, during a first discharge phase, discharge is performed to a bias voltage level, and during a second discharge phase discharge is then performed to a ground voltage level that is different from the bias voltage level. After a time interval 425 of a length dt5 sufficiently long to discharge DAC capacitance 144 close to the bias voltage level at ground, at t6, received digital control signal D controls discharge switch 1433 to enter OPEN state. Thus, discharge switch 1433 disconnects DAC capacitance 144 from ground 101. During a time interval 430 of length dt6, precharge switch 1431, reference voltage switch 1432 and discharge switch 1433 of DAC switch arrangement 143 are in OPEN state. Thus, overlap of two switches in CLOSE state and indefiniteness of circuit state, short circuit current flow from a voltage source to ground and other effects that are adverse to a safe operation of the device, are securely avoided. In comparison with the length dt1 of time interval 405 the length dt6 of time interval 430 can be short.

At time t7, another cycle 400 of work phase precharge, reference charge and discharge of DAC capacitance 144a starts to repeat the cycle performed, starting at time t1, during period TCAP. In some embodiments, as, for example, in the implementation shown in FIG. 4, precharging of digital-to-analog (DAC) capacitance 144a is completed during one period TCLK 401 of clock signal CLK. In contrast, charging to the level of reference voltage VREF is completed in a multiple of clock period TCKL 401. Thus, current flow can be optimised in accordance with implementational needs. In particular, current can be drawn in one relatively strong pulse from voltage supply to provide, already during precharging prior to drawing current from the reference voltage source, most of the charge on DAC capacitance 144a required for the reference voltage level. Consequently, charging DAC capacitance 144a to the reference voltage level draws little current from the reference voltage source and thus avoids drawbacks associated with current flow from the reference voltage source.

In an embodiment, due to precharging DAC capacitance 144 close to the level of the supply voltage VDD or right to the level of the supply voltage VDD, unnecessary charge flow from the reference voltage source coupled to reference voltage line 135 is avoided, since charge only flows to the extent that the precharge voltage level of DAC capacitance 144 differs from the reference voltage level VREF of the reference voltage source.

Figure 5:
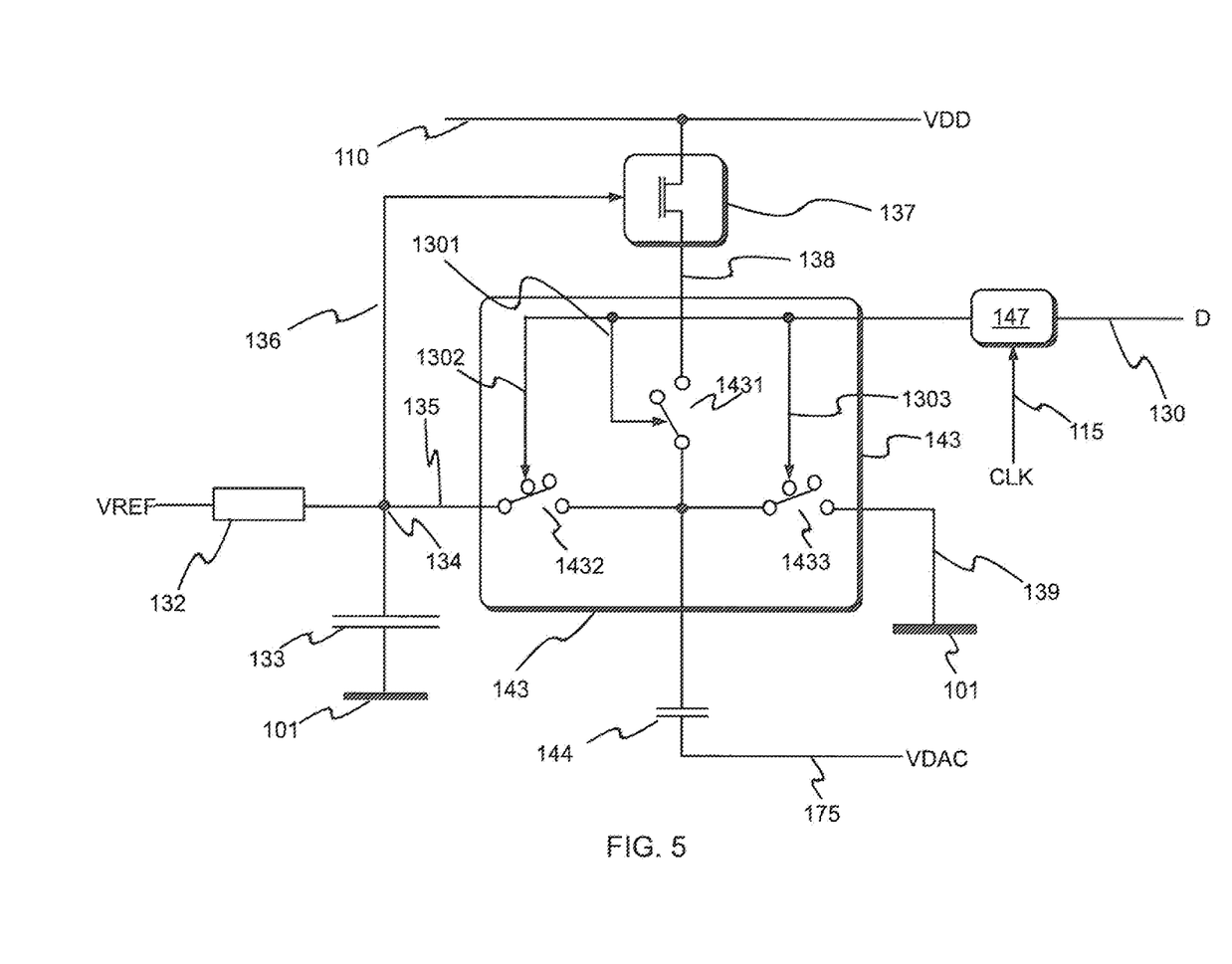
FIG. 5 is a diagram illustrating a variant according to some embodiments of the exemplary implementation shown in FIG. 3.

FIG. 5 is a diagram illustrating variant of the exemplary implementation shown in FIG. 3, wherein the variant additionally comprises voltage level circuitry according to some embodiments. The voltage level circuitry comprises a source follower 137 coupled between voltage supply line 110 and DAC voltage supply branch 138. Further, the voltage level circuitry comprises a source control line 136 connected between node 134 on reference voltage line 135 and source follower 137. The voltage level circuitry provides functionality to the embodiments discussed above that enables precharging of DAC capacitance 144 to be performed to a voltage level that differs from the supply voltage level VDD. Thus, irrespective of the supply voltage level VDD, the device can be configured to achieve a level of precharge voltage that is close to the level of the reference voltage VREF or that about equals the level of the reference voltage VREF. At least one effect can be that reference charge current load on the reference voltage source is particularly low.

Figure 6:
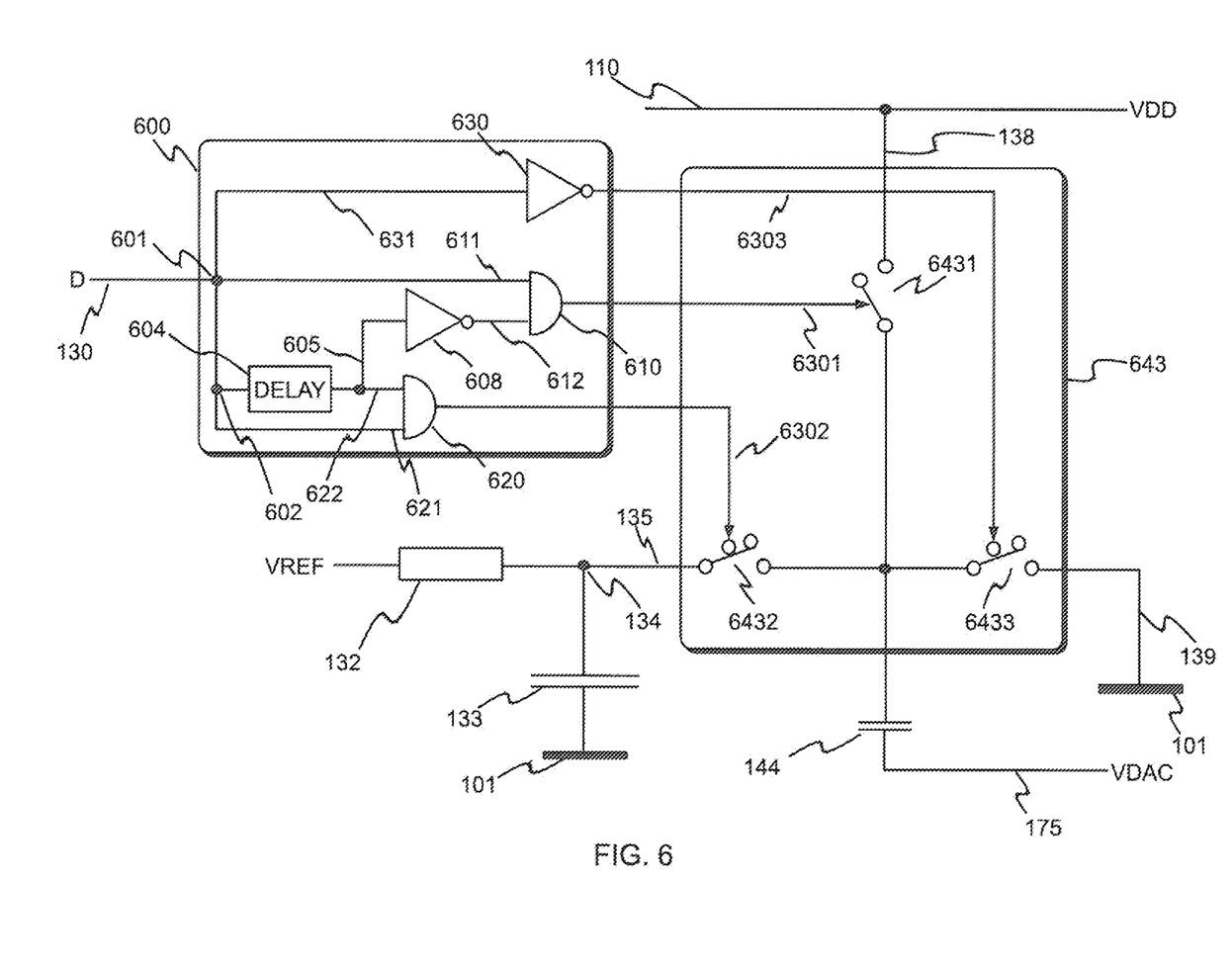
FIG. 6 is a diagram illustrating yet another variant according to some embodiments of the exemplary implementation shown in FIG. 3.

FIG. 6 is a diagram illustrating yet another variant of the exemplary implementation shown in FIG. 3, wherein the variant comprises timing circuitry according to some embodiments. The timing circuitry is shown in a timing block 600 coupled between digital signal line 130 and a capacitive switch arrangement 643 that closely resembles capacitive switch arrangement 143. It should be understood that, according to some implementations, in C-DAC converter 140 of ADC 100 described above, capacitive switch arrangements 643 can take the place of capacitive switch arrangements 143. As will be explained below, according to some embodiments, timing block 600 is configured to process digital control signal D provided from SAR 120 and, as a result of processing digital control signal D, provide enable signals to capacitive switch arrangement 643. Herein, the wording 'processing' can mean one or more of, at least, distributing digital control signal D onto multiple signal paths, performing a logic operation, (e.g., inversion operation, AND operation etc.) on digital control signal D, and delay of digital control signal D.

Capacitive switch arrangement 643 comprises a precharge switch 6431, a reference charge switch 6432 and a discharge switch 6433. Further, capacitive switch arrangement 643 comprises a precharge signal branch 6301 that is coupled to precharge switch 6431 and configured to provide control signalling to precharge switch 6431. Further, capacitive switch arrangement 643 comprises a reference-voltage-charge signal branch 6302 that is coupled to reference voltage switch 6432 and configured to provide control signalling to reference voltage switch 6432. Further, capacitive switch arrangement 643 comprises a discharge signal branch 6303 that is coupled to discharge switch 6433 and configured to provide control signalling to discharge switch 6433. According to an exemplary implementation, capacitive switch arrangement 643 is configured such that changing an enable signal provided to a switch under control of the enable signal, e.g., precharge switch 6431, reference voltage switch 6432, and discharge switch 6433, to LOW level sets the switch under control to OPEN state. Further, capacitive switch arrangement 643 is configured such that changing the enable signal to HIGH level sets the controlled switch to CLOSE state.

Timing circuitry in timing block 600 comprises a first branch node 601 a path of digital signal line 130 splits into digital signal branches 611, 621, 631. A precharge digital signal branch 611 is coupled to a first input to a precharge control AND gate 610, a reference-voltage-charge digital signal branch 621 is coupled to a reference-voltage-charge control AND gate 620. A discharge digital signal branch 631 is coupled to a discharge control signal inverter 630. Further, reference-voltage-charge digital signal branch 621 comprises a second branch node 602 where a path to a delay element 604 branches off that is configured to delay output of a digital control signal that is input to delay element 604 by a predetermined amount of time. An output of delay element 604 is coupled, via a precharge control signal branch 605, to a precharge control signal inverter 608. An output of precharge control signal inverter 608 is coupled, via an inverted signal line 612, to a second input of precharge control AND gate 610. Further, the output of delay element 604 is coupled, via a delayed signal line 622, to a second input of reference-voltage-charge control AND gate 620.

Operation of timing block 600 will now briefly be described, in particular, with reference to FIGS. 4 and 6. At time t0, digital control signal D changes from LOW level to HIGH level (shown in FIG. 4 at reference numeral 441). Accordingly, the first input to precharge control AND gate 610 receives, via first node 601 and precharge digital signal branch 611, digital control signal D changing from LOW level to HIGH level. Having regard to second input to precharge control AND gate 610, digital control signal D, via second node 602, is provided also to delay element 604. Delay element 604, however, delays output of the change 441 from LOW level to HIGH level. Meanwhile, delay element 604 continues to output, a digital control signal in LOW level that, via branch 605, that is provided to precharge control signal inverter 608. Accordingly, precharge control signal inverter 608 outputs, via inverted signal line 612, a HIGH level signal to the second input of precharge control AND gate 610. Consequently, precharge control AND gate 610 outputs, onto precharge signal branch 6301, a HIGH level precharge enable signal to precharge switch 6431. Thus, after a brief interval dt6 of transition, precharge switch 6431 is set in CLOSE state and, at time t1, performance of one cycle 400 of workphases begins, since charge begins to flow from voltage supply line 110, via precharge switch 6431, onto DAC capacitance 144.

At time t2, delay element 604, after completion of a delay time interval dt1, outputs a change in signal from LOW level to HIGH level. Accordingly, precharge control signal inverter 608 receives a signal in HIGH level and outputs a LOW level signal to the second input of precharge control AND gate 610. Consequently, precharge control AND gate 610 outputs, onto precharge signal branch 6301, a LOW level precharge enable signal to precharge switch 6431. Thus, precharge switch 6431 is set to OPEN state and charge ceases to flow from voltage supply line 110 onto DAC capacitance 144.

Still at time t2, also the second input of reference-voltage-charge control AND gate 620 receives the enable signal changing from LOW level to HIGH level as it is output from delay element 604. Consequently, reference-voltage-charge control AND gate 620 outputs, onto reference-voltage-charge signal branch 6302, a change in reference-voltage-charge enable signal from LOW level to HIGH level to reference voltage switch 6432. Thus, reference voltage switch 6432 is set to CLOSE state.

At time t3, after completion of transition time interval dt2, switching state at precharge switch 6431 is completed. Assuming that the predetermined delay time interval dt1 was sufficiently long, at this point in time t3, DAC capacitance 144 is charged to the level of supply voltage VDD.

Further, at time t3, after completion of transition time interval dt2, switching state at reference voltage switch 6432 is completed. Assuming that voltage level on DAC capacitance is below the reference voltage level VREF, charge flows from the reference voltage source, via reference voltage filter arrangement 132, 133, 134, reference voltage line 135 and reference voltage switch 6432, onto DAC capacitance 144.

At time t4, digital control signal D changes from HIGH level to LOW level (shown in FIG. 4 at reference numeral 442). Accordingly, the first input of reference-voltage-charge control AND gate 620, via reference-voltage-charge digital signal branch 621, receives the digital control signal D changing from HIGH level to LOW level. Consequently, reference-voltage-charge control AND gate 620 outputs, onto reference-voltage-charge signal branch 6302, a change in reference-voltage-charge enable signal from HIGH level to LOW level to reference voltage switch 6432. Thus, reference voltage switch 6432 is set to OPEN state.

Further, at time t4, discharge control signal inverter 630 receives, via first node 601 and discharge digital signal branch 631, digital control signal D changing from HIGH level to LOW level. Consequently, discharge control signal inverter 630 outputs, onto discharge signal branch 6303, a HIGH level discharge control signal to discharge switch 6433.

At time t5, after completion of transition time interval dt4, switching state at reference voltage switch 6432 is completed. Assuming that the time interval dt3 was sufficiently long, at this point in time t5, DAC capacitance 144 is charged to the level of reference voltage VREF.

Further, at time t5, after completion of transition time interval dt4, switching state at reference voltage switch 6433 is completed, discharge switch 6433 is set to CLOSE state and charge flows from DAC capacitance 144, via discharge switch 6433 and discharge line 139 to ground 101.

At time t6, digital control signal D changes again from LOW level to HIGH level (shown in FIG. 4 at reference numeral 443). After completion of a transition time interval dt6, resultant switching at discharge switch 6433 is completed. Likewise, switching at precharge switch 6431 that was described above with reference to the beginning of the cycle of charge and discharge, is completed.

After a brief interval dt6 of transition, one cycle 400 of work phases is completed.

Other implementations of timing control of switch arrangement 143, 643 to operate selected DAC capacitance 144 are within the scope of the present disclosure. In some embodiments circuit elements of the circuitry disclosed above are all provided with the same manufacturing technology so as to provide for consistent time and temperature dependent behaviour of a given circuit design irrespective of the manufacturing technology used to implement the respective embodiment in a device such as an integrated circuit chip.

It should be understood that in some alternate embodiments the principles disclosed above with reference to the charge phase are applied to the discharge phase such that the discharge phase encompasses pre-discharging and discharging, either alone or in combination with the charge phase encompassing precharging and charging, is within the scope of this disclosure. In some embodiments the capacitive switch arrangement is therefore configured to include switch control circuitry associated with predischarging the respective capacitance.

This description, in an aspect according to some embodiments, describes a method for use in analog-to-digital-conversion, in particular in operating a circuit for analog-to-digital-conversion. The circuit comprises at least one digital-to-analog (DAC) capacitance in a plurality of DAC capacitances. An embodiment comprises switching a first voltage source, set to a first charge voltage level, to the at least one DAC capacitance. At least one effect can be that the DAC capacitance is, as the case may be, precharged or pre-discharged at the first charge voltage level with charge flowing, in the case of precharging, from the first voltage source onto the at least one DAC capacitance, or, in the case of pre-discharging, from the at least one DAC capacitance into the first voltage source (the first voltage source thus forming a 'first voltage sink'). In an embodiment, for example in the case of precharging, the first voltage source is a supply voltage source. At least one effect can be that drawing charge current from the supply voltage source does not adversely affect other voltages sources. In some embodiments, in the case of pre-discharging, coupling of the at least one DAC capacitance to the first voltage source is performed via a pre-discharge voltage terminal set to a pre-discharge voltage level as the first charge voltage level. An embodiment comprises separating the first voltage source from the at least one DAC capacitance. At least one effect can be that a voltage of the at least one DAC capacitance is held at the first charge voltage level. An embodiment comprises switching a second voltage source, set to a reference voltage level, to the at least one DAC capacitance. In some embodiments, implementing pre-discharging and discharging, the reference voltage level is a discharge voltage level different from the pre-discharge voltage level. In some embodiments, the discharge voltage level is provided by ground. At least one effect can be that the at least one DAC capacitance is, as the case may be, charged or discharged at the reference voltage level with either, in the case of charging, charge flowing from the second voltage source onto the at least one DAC capacitance or, in the case of discharging, charge flowing from the at least one DAC capacitance to the second voltage source (the second voltage source thus forming a 'second voltage sink'). In an embodiment the second voltage source is a reference voltage source. At least one effect can be that higher accuracy of keeping a predetermined voltage level such as the reference voltage level can be achieved than in a case where only the first voltage source is used.

An embodiment comprises separating the second voltage source from the at least one DAC capacitance. At least one effect can be that a voltage of the DAC capacitance is held at the second voltage level. An embodiment comprises switching the at least one DAC capacitance to a discharge terminal that is set to the discharge voltage level. At least one effect can be that charge collected during a previous sample cycle of the sample-and-hold circuit is discharged from the DAC capacitance.

In an embodiment each switching marks entering a different work phase in a sequence of work phases comprising precharge phase, reference charge phase, and discharge phase. In an embodiment there is no overlap between any two work phases. An embodiment comprises setting the precharge voltage level to the reference voltage level. At least one effect can be that during the reference charge phase, no charge flows onto the at least one DAC capacitance.

In some implementations both, charging and discharging, include pre-charging and pre-discharging, respectively. Accordingly, a first reference voltage source for use in charging and a second reference voltage source for use in discharging are provided and set to different voltage levels. For example, as described above, the first reference voltage level is the reference voltage level while the second reference voltage level, i.e., the discharge voltage level, is the level of ground voltage. Further, in some embodiments, the first voltage source, configured for use in pre-charging, and the first voltage source, configured for use in pre-discharging, is the same first voltage source set to a same voltage level. However, in some embodiments, the first voltage source, configured for use in pre-charging, and another first voltage source, configured for use in pre-discharging, are separately provided and set to different voltage levels.

An embodiment comprises deriving the precharge voltage level from a supply voltage level. At least one effect can be that the reference voltage source is unaffected by precharging the DAC capacitance. A buffer, conventionally provided to compensate undesired effects on the reference voltage, may be avoided or designed on less surface than conventionally. In an embodiment the supply voltage level is the reference voltage level. At least one effect can be that, during the reference charge phase, current flow from the reference voltage source is avoided, since, during the precharge phase, the DAC capacitance is already charged, with an accuracy of the supply voltage source, to the reference voltage level.

An embodiment comprises controlling the switching to selectively apply the sequence of work phases to the at least one DAC capacitance. Thus avoidance of power loss due to displacement current associated with precharging, charging and discharging of DAC capacitances that, at a time, are not needed. An embodiment comprises providing a clock signal having a periodic pattern and synchronising the switching and/or separating to the clock signal. Thus each work phase is a multiple of the clock signal, and switching to enter any of the work phases can be synchronised to the clock signal. In an embodiment a duration of the reference charge phase lasts several multiples of a duration of the precharge phase.

This description, in an aspect according to some embodiments, describes a device for use in analog-to-digital conversion. An embodiment comprises a reference voltage terminal configured to be set to a reference voltage, at least one digital-to-analog (DAC) capacitance switchably coupled to the reference voltage terminal, a selector coupled to the at least one DAC capacitance and configured to selectively switch the at least one DAC capacitance to receive the reference voltage, a bias terminal coupled to the at least one DAC capacitance and configured to output a DAC voltage representative of a collective charge stored on the at least one DAC capacitance selected to receive the reference voltage, and a supply voltage terminal configured to be set to a supply voltage, wherein the at least one DAC capacitance is switchably coupled to the supply voltage terminal. At least one effect can be that, while the reference voltage is applied to the at least one DAC capitance, the device provides the DAC voltage. In some embodiments the device is configured to discharge the at least one digital-to-analog converter (DAC) capacitance in multiple phases including at least a pre-discharge phase and a final discharge phase. Applying the principle disclosed in this section with reference to charging the DAC capacitance, discharging is performed during pre-discharging to a first discharge voltage level and, during a discharging, to a second discharge voltage level.

An embodiment comprises a precharge switch coupled between the supply voltage terminal and the at least one DAC capacitance and configured to control charge flow from the supply voltage terminal to the at least one DAC capacitance. At least one effect can be that the supply voltage can be used to precharge the DAC capacitance.

An embodiment comprises a buffer coupled between the supply voltage terminal and the precharge switch. At least one effect can be that the buffer can provide a precharge voltage level different from the supply voltage level and/or close to the reference voltage level so as to reduce current drawn via the reference voltage terminal and avoid adverse effects of drawing too much current from a reference voltage source. In an embodiment the buffer is provided as source follower. Thus, different voltage sources can be used for precharge of the at least one DAC capacitance and for precharge control.

An embodiment comprises a pulse generator coupled to the at least one DAC capacitance and configured to provide a current pulse to precharge the at least one DAC capacitance. In some embodiments at least one further pulse generator is provided such that groups of DAC capacitances are each associated with a different pulse generator, wherein each group of DAC capacitances encompasses at least one DAC capacitance and wherein no two groups of DAC capacitances have any DAC capacitance in common. In an embodiment the pulse generator consists of circuit elements of a same type as the precharge switch. At least one effect can be that dependencies of device performance, for example dependency on process technology used in manufacturing the device, device operating temperature, device operating voltage and others, are the same for the pulse generator and for the precharge switch. Additional compensation circuitry to compensate for different dependencies can be avoided. In an embodiment the pulse generator can be configured to generate precharge current pulses whose length is independent from the reference voltage. In an embodiment the pulse generator is configured to precharge several of the at least one DAC capacitances. In an embodiment the pulse generator is configured to precharge all DAC capacitances of the at least one DAC capacitances. In an embodiment the pulse generator is configured to control a duration of the precharge pulse. At least one effect can be that that the width of the precharge pulse can be controlled digitally.

An embodiment comprises a signal generator configured to provide a clock signal having a periodic pattern and coupled to the precharge switch so as to affect control of the precharge switch. In some embodiments at least one further signal generator is provided such that groups of DAC capacitances are each associated with a different signal generator, wherein each group of DAC capacitances encompasses at least one DAC capacitance and wherein no two groups of DAC capacitances have any DAC capacitance in common. At least one effect can be that a precharge phase can be implemented where the DAC capacitance is precharged to. An embodiment comprises a delay element coupled between the clock generator and the precharge switch so as to affect control of the precharge switch, and configured to delay flow of current from the reference voltage terminal to the DAC capacitance. At least one effect can be that a plurality of switches can successively be addressed by a single switch control signal, wherein the delay element introduces a delay between switching of two successively controlled switches. The delay duration can be used to precharge the DAC capacitance, whereby the amount of charge to flow from the reference voltage terminal can be reduced.

This description, in an aspect according to some embodiments, describes an apparatus for use in analog-to-digital conversion. An embodiment comprises an input voltage terminal configured to receive an input voltage, a digital-to-analog (DAC) device configured to provide a DAC voltage at a DAC terminal, and a comparator coupled to the input voltage terminal and to the DAC terminal and having a control output configured to provide a control output signal, wherein the DAC device is provided according to any of the embodiments disclosed herein. At least one effect can be that the apparatus operates to provide, at the control output of the comparator, an input voltage provided at the input voltage terminal to a digital control signal representative of a level of the input voltage.

Herein, the wording 'exemplary' is used herein to mean serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. Herein, the wording 'techniques,' for instance, may refer to one or more devices, apparatuses, systems, methods, articles of manufacture, and/or computer-readable instructions as indicated by the context described herein. Herein, the wording 'or' is intended to mean an inclusive 'or' rather than an exclusive 'or.' That is, unless specified otherwise or clear from context, 'X employs A or B' is intended to mean any of the natural inclusive permutations. That is, if X employs A. Herein, the wording 'a' and 'an' as articles used in this application and the appended claims should generally be construed to mean 'one or more', unless specified otherwise or clear from context to be directed to a singular form. Herein the wording 'coupled' and 'connected' may have been used to describe how various elements interface. Such described interfacing of various elements may be either direct or indirect.

Although some aspects have been described in the context of an apparatus, these aspects also represent a description of the corresponding functionality, where a block or device corresponds to a functionality or a feature of a function. Analogously, aspects described in the context of a functionality also represent a description of a corresponding block or item or feature of a corresponding apparatus. It is to be understood that the features of the various embodiments described herein may be combined with each other, unless specifically noted otherwise. Although specific embodiments have been illustrated and described herein, it will be appreciated by those of ordinary skill in the art that a variety of alternate and/or equivalent implementations may be substituted for the specific embodiments shown and described. This application is intended to cover any adaptations or variations of the specific embodiments discussed herein. It is intended that this invention be limited only by the claims and the equivalents thereof. Exemplary implementations/embodiments discussed herein may have various components collocated. The implementations herein are described in terms of exemplary embodiments. However, it should be appreciated that individual aspects of the implementations may be separately claimed and one or more of the features of the various embodiments may be combined. In some instances, well-known features are omitted or simplified to clarify the description of the exemplary implementations. In the above description of exemplary implementations, for purposes of explanation, specific numbers, materials configurations, and other details are set fourth in order to better explain the invention, as claimed. However, it will be apparent to one skilled in the art that the claimed invention may be practised using different details than the exemplary ones described herein. The inventors intend the described exemplary embodiments/implementations to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies. The order in which the embodiments/implementations and methods/processes are described is not intended to be construed as a limitation, and any number of the described implementations and processes may be combined. For example, where some implementations were described above with respect to a first and a second functionality, other un-illustrated implementations can include only the first functionality (not second functionality) or can include only the first functionality (not the second functionality). Other permutations and combinations of the above-disclosed concepts are also contemplated as falling within the disclosure. The disclosure includes all such modifications and alterations and is limited only by the scope of the following claims. Having regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure.

The invention claimed is:

1. A method of operating an analog-to-digital-conversion circuit, the analog-to-digital-conversion circuit comprising at least one digital-to-analog (DAC) capacitance in a plurality of DAC capacitances, the method comprising:
    deriving a charge voltage level from a charge voltage switch coupled to a supply voltage level and configured to be set to the charge voltage level, wherein the charge voltage level is set based on the supply voltage level and a reference voltage level supplied to the charge voltage switch;
    switching the at least one DAC capacitance to a first voltage source set to the charge voltage level;
    separating the at least one DAC capacitance from the first voltage source;
    switching the at least one DAC capacitance to a second voltage source set to the reference voltage level;
    separating the second voltage source from the at least one DAC capacitance;
    switching the at least one DAC capacitance to a third voltage source set to a discharge voltage level, wherein the switching of the at least one DAC capacitance to the first voltage source, the second voltage source, and the third voltage source is based on a DAC voltage.

2. The method of claim 1, wherein the charge voltage level is a precharge voltage level.

3. The method of claim 1, wherein each switching marks entering a different work phase in a sequence of work phases comprising precharge phase, reference charge phase, and discharge phase, and wherein there is no overlap between any two work phases.

4. The method of claim 3, the method comprising controlling the switching to selectively apply, in the plurality of DAC capacitances, the sequence of work phases to the at least one DAC capacitance.

5. The method of claim 2, the method comprising setting the precharge voltage level to the reference voltage level.

6. The method of claim 1, the method comprising providing a clock signal having a periodic pattern, and synchronizing the switching and/or separating to the clock signal.

7. The method of claim 3, wherein a duration of the reference charge phase lasts several multiples of a duration of the precharge phase.

8. A circuit device, for use in analog-to-digital conversion, the circuit device comprising:
    a reference voltage terminal configured to be set to a reference voltage;
    a supply voltage terminal configured to be set to a supply voltage;
    a precharge switch coupled to the supply voltage terminal and configured to be set to a precharge voltage, wherein the precharge voltage is based on the supply voltage and the reference voltage;
    a discharge voltage terminal configured to be set to a discharge voltage;
    at least one digital-to-analog (DAC) capacitance switchably coupled to the reference voltage terminal, the precharge voltage terminal, and the discharge voltage terminal;
    a selector coupled to the at least one DAC capacitance and configured to selectively switch the at least one DAC capacitance to receive:
        the reference voltage in a first work phase,
        the precharge voltage in a second work phase, and
        the discharge voltage in a third work phase; and
    a bias terminal coupled to the at least one DAC capacitance and configured to output a DAC voltage representative of a collective charge stored on the at least one DAC capacitance, wherein the selector is configured to selectively switch the at least one DAC capacitance between the first, second, and third work phases based on the DAC voltage.

9. The circuit device of claim 8, wherein the precharge switch is coupled between the supply voltage terminal and the at least one DAC capacitance and configured to control charge flow from the supply voltage terminal to the at least one DAC capacitance.

10. The circuit device of claim 9, the device further comprising a buffer coupled between the supply voltage terminal and the precharge switch.

11. The circuit device of claim 9, the circuit device further comprising a pulse generator coupled to the at least one DAC capacitance and configured to provide a current pulse to precharge the at least one DAC capacitance.

12. The circuit device of claim 11, wherein the pulse generator consists of circuit elements of a same type as the precharge switch.

13. The circuit device of claim 11, wherein the pulse generator is configured to precharge several of the at least one DAC capacitances.

14. The circuit device of claim 11, wherein the pulse generator is configured to control a duration of the precharge pulse.

15. The circuit device of claim 9, the circuit device further comprising a signal generator configured to provide a clock signal having a periodic pattern and coupled to the precharge switch so as to affect control of the precharge switch.

16. The circuit device of claim 9, the circuit device further comprising a delay element coupled between the clock generator and the precharge switch so as to affect control of the precharge switch, and configured to delay flow of current from the reference voltage terminal to the DAC capacitance.

17. An analog-to-digital-conversion apparatus comprising an input voltage terminal configured to receive an input voltage, a digital-to-analog circuit device configured to provide a digital-to-analog voltage at a digital-to-analog terminal, and a comparator coupled to the input voltage terminal and to the digital-to-analog terminal and having a control output configured to provide a control output signal, wherein the digital-to-analog device is provided according to circuit device claim 8.

18. The circuit device of claim 8, wherein the selector is configured to selectively switch the at least one DAC capacitance between the first, second, and third work phases based on a comparison of the DAC voltage and a sample-and-hold voltage.

19. The circuit device of claim 8, further comprising a successive approximation register (SAR) configured to generate one or more control signals based on the DAC voltage, wherein the selector is configured to selectively switch the at least one DAC capacitance between the first, second, and third work phases based on the one or more control signals.

20. The circuit device of claim 19, wherein the SAR is configured to generate the one or more control signals based on a comparison of the DAC voltage and a sample-and-hold voltage.

* * * * *